United States Patent [19]

Hung et al.

[11] Patent Number: 4,874,799
[45] Date of Patent: Oct. 17, 1989

[54] AQUEOUS AKALINE DEVELOPABLE, UV CURABLE URETHANE ACRYLATE COMPOUNDS AND COMPOSITIONS USEFUL FOR FORMING LIQUID 100 PERCENT SOLIDS, SOLVENT-FREE SOLDER MASK COATINGS

[75] Inventors: Paul L. K. Hung, Edison; Kenneth K. S. Tseng, Piscataway, both of N.J.

[73] Assignee: M&T Chemicals Inc., Woodbridge, N.J.

[21] Appl. No.: 71,849

[22] Filed: Jul. 10, 1987

Related U.S. Application Data

[63] Continuation-in-part of Ser. No. 735,411, May 17, 1985, Pat. No. 4,717,740.

[51] Int. Cl.$^4$ .......................... C08F 2/50; C08F 20/58
[52] U.S. Cl. ........................................ 522/96; 522/97; 430/284; 525/920; 526/301; 528/75; 560/84; 560/88; 560/90; 560/115; 560/158
[58] Field of Search .................................. 522/90–98; 560/88, 90, 115, 158; 526/301

[56] References Cited

U.S. PATENT DOCUMENTS

| | | | |
|---|---|---|---|
| 3,850,770 | 11/1974 | Juna | 525/920 |
| 4,188,472 | 2/1980 | Chang | 528/75 |
| 4,228,232 | 10/1980 | Rousseau | 522/95 |
| 4,357,219 | 11/1982 | Sattler | 522/95 |
| 4,458,007 | 7/1984 | Geissler | 522/95 |
| 4,481,281 | 11/1984 | Tsao | 522/97 |
| 4,680,361 | 7/1987 | Koleske | 526/318 |
| 4,691,045 | 9/1987 | Fukuchi | 522/96 |
| 4,717,740 | 1/1988 | Hung | 522/96 |

*Primary Examiner*—John C. Bleutge
*Assistant Examiner*—Arthur H. Koeckert
*Attorney, Agent, or Firm*—S. A. Marcus; R. B. Henn; R. G. Ort

[57] ABSTRACT

Aqueous alkaline developable, UV curable urethane acrylate compounds and compositions are particularly useful for making flexible, 100% solids, solvent-free solder mask coatings which are characterized by having screen-printable viscosities, rapid developability and advantageous performance characteristics.

30 Claims, No Drawings

AQUEOUS AKALINE DEVELOPABLE, UV CURABLE URETHANE ACRYLATE COMPOUNDS AND COMPOSITIONS USEFUL FOR FORMING LIQUID 100 PERCENT SOLIDS, SOLVENT-FREE SOLDER MASK COATINGS

CROSS-REFERENCE TO RELATED PATENT APPLICATIONS

This application is a continuation-in-part of U.S. patent application Ser. No. 735,411, filed May 17, 1985, now U.S. Pat. No. 4,717,740, by the same inventors, and assigned to the same assignee as this application.

BACKGROUND OF THE INVENTION

1. Field of the Invention

This invention relates to solder mask coatings having improved performance characteristics, and, more particularly, to aqueous alkaline developable, UV curable acrylate compounds and compositions useful for forming 100% solids, solvent-free, photoimageable liquid solder masks.

2. Description of the Prior Art

An article in "Circuits Manufacturing", pages 24-33 (January, 1987) describes the recent commercial advances in the art of photoimageable liquid solder masks, which are intended to provide technical and cost advantageous over traditional dry film solder masks.

A number of U.S. patents disclose photopolymerizable oligomers and compositions for use as solder masks in printed circuit boards, including U.S. Pat. Nos. 3,660,088; 3,753,720; 3,883,352; 3,887,450; 4,199,163; 4,228,232; 4,304,923; 4,361,640; 4,436,806; 4,458,007; 4,481,281; and 4,508,916. However, none of those UV curable compounds and compositions are entirely satisfactory for use as a commercial solder mask, particularly for a screen-printable, photoimageable, 100% solids, solvent-free liquid solder mask which exhibits advantageous performance characteristics, and is aqueous alkaline developable.

Rousseau, in U.S. Pat. No 4,228,232, describes an oligomer and composition for use in a presensitized plate for printing operations, such as is used in the formation of lithographic plates. For such application, the oligomers must be tough but do not require flexibility, and heat, chemical and electrical insulation resistance, high photoresponse, screen printability, adhesion to substrate, and other properties essential for solder mask operation. Accordingly, Rousseau's oligomer has a high molecular weight polymeric backbone derived from an aromatic diisocyanate and polymeric polyols, as polyester and polyalkylene polyols, which have molecular weights up to 10,000, and high hydroxy equivalent weights of 45 to 5,000, most preferably 200 to 2,000. The compositions formulated by Rousseau from these oligomers require an organic solvent to make the oligomers soluble.

Rendulic, in U.S. Pat. No. 4,436,806 describes a method and apparatus for making a printed circuit board by imaging a liquid polymer which has been coated onto the board by roller coating. In this process, imaging is carried out while the polymer is wet and the phototool is positioned in close proximity to the coated board. The liquid polymer compositions disclosed by Rendulic for use in this process are urethane acrylates having a polyether or polyester polyol chain extending unit. Such compositions have a very low viscosity, which is desirable for forming coatings with a roller coater. However, these compositions have a relatively low degree of ethylenic unsaturation per weight unit so that they require a relatively high energy level for curing.

In contrast to the imaging technique of the above mentioned patent, Sullivan, in U.S. Pat. No. 4,506,004, describes a contact method of imaging a liquid solder mask coating is screen printed to a given thickness, prehardened and imaged by exposure with suitable UV energy. The desired characteristics of excellent product performance and printing resolution are the attributes of the Sullivan system. The requirements of a suitable liquid photopolymerizable compound for use in this process include an ability to form a smooth, flexible coating which can impart chemical, electrical insulation and heat resistance to the solder mask. Furthermore, the coating must exhibit excellent adhesion to the printed circuit board with different types of metallization, and an ability to be cured to a desired depth with a minimum amount of UV energy.

Accordingly, an object of the invention is to provide a solder mask coating which can be developed with an aqueous, slightly alkaline solution, thereby avoiding the use of organic solvents in the developing step. The solder mask coatings also should exhibit flexibility, heat, chemical and electrical insulation resistance, surface hardness, abrasion resistance, adhesion to the underlying metal of the printed circuit board, and high cure depth at a low U.V. dosage. These stringent requirements imply that the structure of the prepolymer and its formulation must be carefully designed before the solder mask can hope to achieve commercial acceptability.

A further object of this invention to provide a liquid UV curable urethane acrylate compound, and a 100% solids, solvent-free composition for use as a solder mask, which composition can be developed rapidly in an aqueous, slightly alkaline solution, preferably at a rate of at least 1 mil/min., at temperature of less than 39° C. and at a pH of 8-11, without leaving a residue.

Another object of this invention is to provide a UV curable urethane acrylate compound and composition having a suitable viscosity which enables coating by screen printing techniques to form a smooth, uniform, glossy, flexible coating of a thickness of 2 mils or more.

Still another object herein is to provide such a solder mask coating which can be cured, preferably at an energy level of less than 0.3 joules per sq. cm., to provide a cure depth of at least 18 mils at this energy level.

Yet another object of the invention is to provide a solder mask composition which is stable without gelation for at least six months, under ambient storage conditions.

A further object herein is to provide a flexible solder mask coating having excellent adhesion to the underlying metal of the printed circuit board, particularly on copper and tin-lead.

Another object herein is to provide a solder mask coating which exhibits good surface hardness, abrasion, heat, organic solvent and electrical insulation (Class III-IPC) resistance.

A specific object herein is to provide a composition which is particularly adapted for use in the method and apparatus of making printed circuit boards described in U.S. Pat. No. 4,506,004.

A further object of the invention is to provide a UV curable urethane acrylate compound and composition which meets acceptable environmental standards.

SUMMARY OF THE INVENTION

This invention provides a liquid, UV curable, aqueous alkaline developable urethane acrylate compound for formulation into a composition useful in making a solder mask coating. The urethane acrylate compound of the invention is obtained by reacting:

(i) two moles of at least one aliphatic or cycloaliphatic diisocyanate, e.g. dicyclohexylmethylene diisocyanate, isophorone diisocyanate, or hexamethylene diisocyanate;
(ii) two moles of a hydroxy extended-alkyl acrylate; e.g. a caprolactone acrylate monomer;
(iii) one mole of a simple alkylene polyol compound having 3–6 hydroxyl groups and 3–6 carbon atoms; e.g. glycerol; and
(iv) at least one mole of dicarboxylic acid or anhydride, saturated or unsaturated; e.g. maleic anhydride.

The urethane acrylate compound of the invention is characterized by the following chemical constituents:
(a) terminal ethylenic unsaturation;
(b) at least one terminal carboxylic acid group;
(c) an intermediate aliphatic or cycloaliphatic urethane group; and
(d) simple alkylene groups connecting said terminal and intermediate groups, one of which is an extended-alkylene group.

The general formula of the urethane acrylate compound of the invention is the following:

wherein
n is 1–8,
X is derived from a caprolactone, capralactam or epoxide,
$R_1$ is an aliphatic or cycloaliphatic group, m is 1–3,
$R_2$ is alkylene $C_1$–$C_6$,
y is 0–3,
$R_3$ is aliphatic or cycloaliphatic, saturated or unsaturated, or aromatic,
and z is 1–3.
Preferably, n is 2–3;

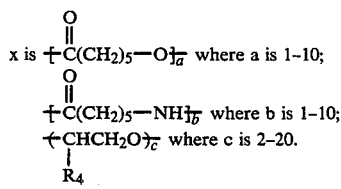

$R_1$ is dicyclohexylmethylene;
m is 1 or 2;
$R_2$ is derived from glycerol;
y is 0 or 1;
$R_3$ is derived form maleic anhydride,
Z is 1, and
$3 \leq m+y+z \leq 6$ and $R_4$ is H or alkyl,
A most preferred compound is:

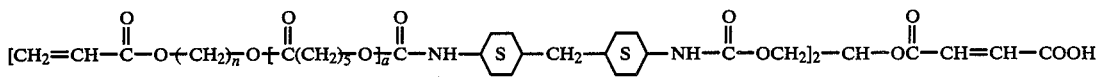

where m=2, z=1 and y=0.
Another preferred compound in the above formula is one in which m=1, z=1 and y=1.

Further, this invention provides, 100% solids, solvent-free UV curable, aqueous alkaline developable urethane acrylate solder mask compositions comprising:
(a) 10–50% by weight of the above-described urethane acrylate compound,
(b) 5–40% by weight of an aromatic urethane diacrylate;
(c) 2–30% by weight of an aliphatic or cycloaliphatic urethane diacrylate;
(d) 4–60% by weight of one or more reactive monomer diluents; and
(e) 0.5–10% by weight of a photoinitiator.

The composition of the invention also may include about 1–5% by weight of one or more of the following: a cross linking agent, a pigment of dye, a rheology modifier, a thermal stabilizer, a filler, an adhesion promotor, a flame retardant and a leveling aid.

Physically, the urethane acrylate compound of the invention is characterized by having a viscosity amenable to formulation into a 100% solids, solvent-free composition which is screen printable onto a printed circuit board to form a useful liquid solder mask, a level of volatility which conforms to acceptable standards, and otherwise enables the preparation of a high performance liquid solder mask.

A feature of the invention is to provision of a printed circuit board having a liquid solder mask thereon as a smooth, glossy, flexible coating, which can be cured at low energy levels to provide a high cure depth, excellent surface hardness, and abrasion, heat, organic solvent and electrical insulation resistance (Class III-IPC). The coating can be developed rapidly in an aqueous, slightly alkaline medium at ambient temperature.

DETAILED DESCRIPTION OF THE INVENTION

The UV curable, aqueous alkaline developable urethane acrylate compound of this invention can be obtained by a three-step, one-pot reaction in which the four reactants are added sequentially in the same reaction vessel, as follows:

FIRST STEP

This first step involves reacting two moles of a suitable diisocyanate with two moles of a suitable hydroxy extended-alkyl acrylate to form the corresponding isocyanate-capped acrylate.

Suitable diisocyanates for use in this step are aliphatic and cycloaliphatic diisocyanates, e.g. dicyclohexylmethylene diisocyanate, isophorone diisocyanate, hexamethylene diisocyanates, and trimethylhexamethylene diisocyanate.

The hydroxy extended-alkyl acrylate monomer reactant may be selected from reaction products of such hydroxyalkyl acrylate compounds as hydroxymethyl acrylate, hydroxyethyl acrylate, hydroxypropyl acrylate, hydroxybutyl acrylate and the like, with a suitable alkyl chain extender, such as a caprolactone, caprolactam, an epoxide, and the like. A preferred reaction product is available commercially as "Tone M-100," from Union Carbide Corp., which is caprolactone acrylate monomer.

For purposes of this invention, the term "acrylate" includes the corresponding "methacrylate" derivative.

SECOND STEP

In this step, one mole of a simple alkylene polyol compound is added to the intermediate of the first step to hydroxyalkylene encap the remaining end of the diisocyanate.

Suitable alkylene polyols have 3–6 hydroxyl groups and 3–6 carbon atoms. Prefaced compounds are glycerol, trimethylolpropane, 1,2,6-hexanetriol, pentaerythritol, L-arabinose, dipentaerythritol and sorbitol. Glycerol is most preferred.

THIRD STEP

In the final step of the synthesis of the urethane acrylate compound of the invention, at least one half mole of a dicarboxylic acid or anhydride is added to form the desired terminal acid group in the molecule.

Dicarboxylic acid anhydrides are preferred for this step because they react faster than the corresponding acids. Suitable acid anhydrides include maleic, succinic, glutaric, adipic and phthalic anhydrides. Maleic anhydride is a preferred acid anhydride, in an amount of at least one half mole per mole of polyol.

PREFERRED EMBODIMENT

In accordance with the preferred embodiment of the invention, there is shown below the three-step reaction of 2 moles of dicyclohexylmethylene diisocyanate (I), with 2 moles of caprolactone acrylate monomer (Tone M-100) (II), followed by condensation with one mole of glycerol (III), and one mole of maleic anhydride (IV), as follows:

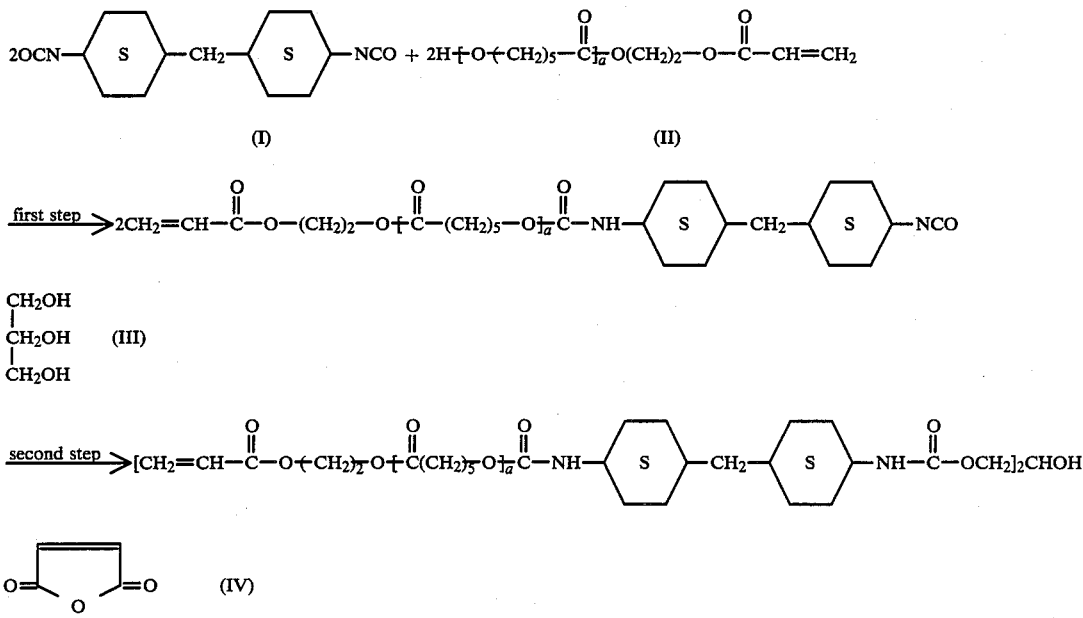

Using one mole of pentaerythritol in place of glycerol syntheses, and two moles of maleic anhydride, the corresponding pentaerythritol derivative with two acid groups is obtained.

SOLDER MASK FORMULATION

A. Composition

The invention also provides a 100% solids, solvent-free, UV curable, aqueous alkaline developable urethane acrylate composition for forming a solder mask, which composition comprises:

a. 10–50% preferably 15–30%, by weight of the urethane acrylate compound of the invention,
b. 5–40% preferably 10–30% by weight of an aromatic urethane diacrylate,
c. 2–30% preferably 5–20%, by weight of an aliphatic or cycloaliphatic urethane diacrylate, or mixtures thereof,
d. 4–60% preferably 10–35%, by weight of one or more reactive monomer diluent, and
e. 0.5–10% preferably 1–3 wt. % by weight of a photoinitiator.

B. Sources of Components of Composition a. As described above and examples which follow.
b. Reaction of aromatic diisocyanate and hydroxyalkyl acrylate.
c. Photomer 6008 (Diamond Shamrock) or SR-9503 (Sartomar Co.) (as 100% reactive materials), for example.
d. The reactive diluent monomers are included in the composition of the invention to reduce its viscosity and further increase its curing rate. Suitable reactive diluent monomers for use therein include ethylenically unsaturated monomers that are compatible and copolymerizable with the urethane acrylate and urethane diacrylates of the invention. Such ethylenically unsaturated monomers include mono-, di- and triacrylates as, for example, hydroxyalkyl acrylates, such as e.g. hydroxyethyl acrylate; and acrylate esters, e.g. methyl methacrylate, ethyl acrylate, 2-ethylhexyl acrylate, cyclohexyl acrylate, isobutoxymethyl methacrylate, t-butyl acrylate, methyl acrylate, butyl acrylate, 2-(N-ethylcarbamyl) ethyl methacrylate; aryloxyalkyl acrylates, e.g. phenoxyethyl acrylate; bis-phenol A diacrylate, ethylene glycol diacrylate, polyethylene glycol diacrylate, glycerol diacrylate and methacrylate, bis-phenol A diacrylate, tetrapropylene glycol diacrylate, and the like. Suitable triacrylates include glycerol triacrylate, ethoxylated trimethylol propane triacrylate, and the like.

Other reactive compounds can be included in d. to increase the cross-linking density of the coating. Such reactive compounds include, but are not limited to, pentearythritol 3-mercaptopropionate, 1,4-butylene dimethacrylate or acrylate, 1,1,6-6-tetrahydroperfluorohexanediol diacrylate, ethylene dimethacrylate, glycerol diacrylate or methacrylate, glycerol trimethacrylate, diallyl phthalate and 1,3,5-tri (2-methacryloxyethyl)-s-triazine.

e. The UV curable composition of this invention also contains a photoinitiator which generates free radicals owing to actinic light. Suitable examples of such photoinitiators include substituted and unsubstituted polynuclear quinones, such as 2-ethylanthraquinone, 2-t-butylanthraquinone, octamethylanthraquinone, 1,2-benzanthraquinone, 2,3-diphenylanthraquinone, thioxanthone, e.g. chloro and isopropyl derivates, and the like; ketoaldonyl compounds such, as diacetyl, benzyl and the like; aketoaldonyl alcohols and ethers, such as benzoin, pivalone, and the like; α-hydrocarbon-substituted aromatic acyloins such as a-phenylbenzoin, α,α-diethoxyacetophenone, and the like; and aromatic ketones such as benzophenone, 4,4'-bisdialkylaminobenzophenone, and the like. These photoinitiators may be used alone or as a combination of two or more of them. Examples of combinations include 2,4,5-triarylimidazole dimer and 2-mercaptobenzoquinazole, leucocrystal violet, tris (4-diethylamino-2-methylphenyl) methane, or the like, and compounds which may not have photoinitiating properties alone but which nevertheless can constitute a good photoinitiating system, in combination with the above-mentioned materials. Such compounds include, for example, tertiary amines, such as triethanolamine and the like, which are used in combination with benzophenone.

f. Optional components:

The composition preferably includes other components of a commercial composition such as a crosslinker, e.g. hexaalkoxymelamine; a flame retardant, such as a mixture of a brominated compound and antimony trioxide or pentoxide; a rheology modifier; a pigment dispersion aid; and a cure rate enhancer, such as triphenylphosphite.

The invention will be illustrated now by way of the following examples:

EXAMPLE 1

| Urethane Acrylate Reaction Product of (Desmodur W/Tone M-100)$_2$/Glycerol/Maleic Anhydride | | | |
|---|---|---|---|
| Reactant | Parts | Equivalents | Mole |
| A. 4,4'-dicyclohexylmethylene | 524 | 4 | 2 |

| -continued | | | |
|---|---|---|---|
| Urethane Acrylate Reaction Product of (Desmodur W/Tone M-100)$_2$/Glycerol/Maleic Anhydride | | | |
| Reactant | Parts | Equivalents | Mole |
| diisocyanate (Des W)$_2$ | | | |
| B. Dibutyltin dilaurate | 3.6 | 2000 ppm | |
| C. Tone M-100 (Union Carbide) | 688 | 2 | 2 |
| D. Phenoxyethyl acrylate (diluent) | 601 | 3.13 | |
| E. Glycerol | 92 | 3 | 1 |
| F. Maleic anhydride | 98 | 1 | 1 |

G. Hydroquinone methyl ether 3.6 2000 ppm

A 3-liter dry resin kettle equipped with a mechanical stirrer, thermometer, drying tube and pressure equalizing dropping funnel was charged with 2 equivalents of (A), (D) and 1000 ppm of (B). The mixture was stirred while (C) was added slowly through the dropping funnel over 30 min. The temperature of the reaction mixture was maintained at below 50° C. After the addition of (C) was completed the mixture was maintained at 60° C. until the NCO number was 4.4±0.2. The temperature of the mixture then was lowered to 40° C. and 1000 ppm of (B) was added followed by dropwise addition of (E) over 15 min. The temperature was maintained at below 55° C. during the addition and then at 60° C. until infrared spectroscopy showed the absence of NCO absorption at 2275 cm$^{-1}$. (F) then was added to the reaction mixture at 70°-75° C. over 20 min. followed by (G). Heating was continued at 85°-90° C. IR showed the absence of 1845 and 1975 cm$^{-1}$ peaks.

The product was a viscous liquid in 30 wt. % phenoxyethyl acrylate, having a viscosity of 35,000 cps at 25° C.; the acid group contents was 0.66 meg/gm.

EXAMPLE 2

| Urethane Acrylate Reaction Product of (Desmodur W/Tone M-100)$_2$/Sorbitol/(Maleic Anhydride) | | | |
|---|---|---|---|
| Reactant | Parts | Equivalent | |
| A. Tone M-100 | 688 | 2 | |
| B. 4,4'-dicyclohexylmethylene diisocyanate | 262 | 2 | |
| C. Sorbitol | 182.2 | 1 | |
| D. Maleic anhydride | 98 | 1 | |
| E. Phenoxy ethyl acrylate | 1488 | (diluent) | |
| F. Dibutyltin dilaurate (T-12) | 5.9 | 2000 ppm | |

G. Hydroquinone methyl ether 5.9 2000 ppm

A resin kettle equipped with a mechanical stirrer, thermometer, drying tube and pressure equalizing dropping funnel was charged with (B), (E) and 2.0 g. of T-12. The mixture was stirred while (A) was added slowly over ½ hr. The temperature was maintained at below 50° C. Upon completion of addition, the mixture was maintained at 55°-60° C. for 3 hrs. or until the NCO number was 3.3±0.3, as determined by titration. The reaction mixture was cooled to 40° C. and (C) was added slowly over 15 min. followed by 2.0 g of T-12. The temperature was raised to and maintained at 60°±2° C. until infrared showed the absence of NCO absorption at 2275 cm$^{-1}$. (D) and 1.9 g T-12 were added and the temperature was maintained at 90°-95° C. for 5 hr. or until infrared showed the absence of maleic anhydride peaks at 1845 cm$^{-1}$. (G) then was added and stirred for 15 min. The product was a viscous liquid having a viscosity of 27,200 cps at 25° C. and an acid number of 27.9 or 0.5 meg/gm acid content.

EXAMPLE 3

The procedure of Example 1 was followed using trimethylolpropane, 1,2,6-hexanetriol and pentaerythritol in place of glycerol to provide the corresponding urethane acrylate derivatives.

EXAMPLE 4

Preparation of Aromatic Urethane Diacrylate

Toluene diisocyanate (1 mole) and hydroxypropyl acrylate (2 moles) were reacted at 55C. for 6 hrs. to give the desired product, which was a viscous liquid having a Brookfield viscosity of 68,000 cps at 50° C.

EXAMPLE 5

Solder Mask Composition

The following composition used to form a solder mask coating on a printed circuit board.

| COMPOSITION | |
|---|---|
| Component | Parts by Wt. |
| Urethane acrylate of Ex. 1 | 23 |
| Aromatic urethane diacrylate of Ex. 4 | 17.5 |
| Aliphatic urethane diacrylate | 9 |
| Reactive diluent monomers | 20 |
| Hexamethoxy melamine - thermal cross-linker | 8 |
| 2,2-Dimethoxy-2-phenylacetophenone-photoinitiator | 2 |
| Pigment-phthalocyanine green | 0.3 |
| Leveling agent | 0.8 |
| MTBHQ - mono-tert.-butyl hydroquinone-stabilizer | 0.2 |
| Brominated flame retardant and antimony trioxide - flame retardant | 8 |

The composition had a Brookfield viscosity of 15,000 cps at 100 rpm at 23° C., and was stable without gelation for more than 1 year.

EXAMPLE 6

Solder Mask on Printed Circuit Board

A copper-clad epoxy fiber glass printed circuit board was cleaned by scrubbing to remove corrosion and foreign material and coated by screen printing with the composition of Example 5 to a thickness of about 3 mils. Thereafter another 3 mil thick coating was applied onto a phototool in accordance with the method given in U.S Pat. No. 4,506,004, Example 2. The two coatings then were mated to form a composite coating of 6 mils thickness, flipped over and given a main exposure with 0.5 joules per cm² for 30 seconds. The unexposed coating then was developed by removing it (negative working) in a 1% sodium carbonate solution (pH 11) at room temperature for 4 min., baked at 150° C. for 1 hr., and finally cured with 2 joules per cm² of UV energy.

The cured solder mask was a smooth, uniform, glossy, and flexible coating having 100% adhesion under a cross-hatch tape test both before and after application of solder; resistant to organic solvents for more than 15 minutes in an immersion test; exhibited excellent legend ink adhesion characteristics; excellent heat resistance as measured by a 20-second dip in solder at a temperature of 285° C. without blistering; surface pencil hardness of greater than H, and very good abrasion resistance; excellent adhesion to the printed circuit board, and an electrical insulation resistance which exceeds Class III (IPC-5M-840A) requirements of $5 \times 10^8$ ohm-cm. after 7 days at 25°-65° C. cycling at 90% R.H.

Although the invention has been described with particular reference to certain preferred embodiments thereof, it will be understood that modifications and changes may be made which are within the skill of the art. Accordingly, it is intended to be bound only the appended claims.

What is claimed is:

1. A liquid, UV curable, aqueous alkaline developable urethane acrylate compound comprising the reaction product of two moles each of an aliphatic or cycloaliphatic diisocyanate and a hydroxy extended alkyl acrylate monomer formed by reaction of a hydroxyalkyl acrylate and caprolactone with one mole of an alkylene polyol having 3-6 hydroxyl groups and 3-6 carbon atoms, and at least one-half mole of a dicarboxylic acid or anhydride per mole of said polyol.

2. A compound according to claim 1 wherein said diisocyanate is selected from the group consisting of dicyclohexylmethylene diisocyanate, isophorone diisocyanate and hexamethylene diisocyanate.

3. A compound according to claim 1 wherein said diisocyanate is dicyclohexylmethylene diisocyanate.

4. A compound according to claim 1 wherein said diisocyanate is isophorone diisocyanate.

5. A compound according to claim 1 wherein said diisocyanate is hexamethylene diisocyanate.

6. A compound according to claim 1 wherein said alkylene polyol is glycerol, trimethylolpropane, 1,2,6-hexanetriol, pentaerythritol, L-arabinose, dipentaerythritol and sorbitol.

7. A compound according to claim 1 wherein said alkylene polyol is glycerol.

8. A compound according to claim 1 wherein said di-carboxylic acid or anhydride is an unsaturated dicarboxylic acid or anhydride.

9. A compound according to claim 8 wherein said dicarboxylic anhydride is maleic anhydride.

10. A compound according to claim 1 comprising the reaction product of two moles each of dicyclohexyl methylene diisocyanate and said hydroxy extended alkyl acrylate monomer, and one mole each of glycerol and maleic anhydride.

11. A compound according to claim 1 wherein said reaction product is obtained using one mole of a dicarboxylic acid or anhydride per mole of said polyol.

12. A compound having the general formula:

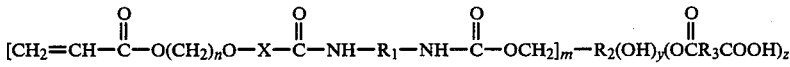

where
n is 1-8,

and a is 1-10,
R₁ is an aliphatic or cycloaliphatic group,
m is 2-3, $R_2$ is alkylene $C_1$-$C_6$,
y is 0-3,
$R_3$ is aliphatic or cycloaliphatic, saturated or unsaturated, or aromatic,
z is 1-3; and
$3 \leq m+y+z \leq 6$.

13. A compound according to claim 12 wherein n is 2-3.

14. A compound according to claim 12 wherein;
$R_1$ is dicyclohexylmethylene;
m is 2;
$R_2$ is derived from glycerol;
y is 0 or 1;
$R_3$ is derived from maleic anhydride; and
z is 1.

15. A compound which is

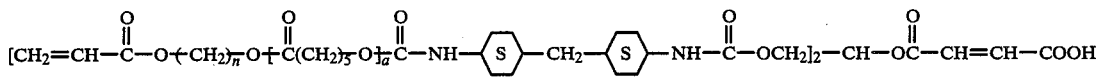

where
a is 1-10, and
n is 1-8.

16. A compound according to claim 12, in which m is 2.

17. A compound according to claim 12 wherein m=x, y=0 and z=1.

18. A 100% solids, solvent-free, UV Curable aqueous developable composition comprising:
(a) 10-50% by weight of a urethane acrylate compound which is the reaction product of (i) two moles each of an aliphatic or cycloaliphatic diisocyanate and (ii) a hydroxy extended-alkyl acrylate monomer formed by reaction of a hydroxyalkyl acrylate and caprolactone with (iii) one mole of an alkylene polyol carbon atoms, having 3-6 hydroxyl groups and 3-6 carbon atoms, and (iv) at least one mole of a carboxylic acid or anhydride per mole of said polyol;
(b) 5-40% by weight of an aromatic urethane diacrylate formed by reaction of one mole of an aromatic diisocyanate and two moles of a hydroxyalkyl acrylate;
(c) 2-30% by weight of an aliphatic or cycloaliphatic urethane diacrylate formed by reaction of one mole of an aliphatic or cycloaliphatic diisocyanate and two moles of a hydroxyalkyl acrylate;
(d) 4-60% by weight of one or more reactive monomer diluents; and
(e) 0.5-10% by weight of a photoinitiator.

19. A composition according to claim 18 wherein (a) is 15-30%; (b) is 10-30%; (c) is 5-20% by weight.

20. A composition according to claim 18 wherein (a)(i) is selected from dicyclohexylmethylene diisocyanate, isophorone diisocyanate and hexamethylene diisocyanate.

21. A composition according to claim 18 wherein (a)(iii) is glycerol, trimethylolpropane, 1,2,6-hexanetriol, pentaerythritol, L-arabinose, dipentaerythritol or sorbitol.

22. A composition according to claim 21 wherein (a)(iii) is glycerol.

23. A composition according to claim 18 wherein (a)(IV) is an unsaturated dicarboxylic acid or anhydride.

24. A composition according to claim 23 wherein said dicarboxylic acid or anhydride is maleic anhydride.

25. A composition according to claim 18 wherein (d) includes a hydroxyalkyl acrylate.

26. A composition according to claim 18 wherein (d) includes an aryloxyalkyl acrylate.

27. A composition according to claim 26 wherein said aryloxyalkyl acrylate is phenoxyethyl acrylate.

28. A composition according to claim 18 which also includes 1-15% by weight of one or more of the following: a crosslinker, a pigment or dye, a rheology modifier, a thermal stabilizer, a filler, an adhesion promotor, a flame retardant and a leveling aid.

29. A composition according to claim 18 wherein (d) is present in an amount of 10-35% and (e) in 1-3% by weight of said composition.

30. The solder mask product of the cured composition of claim 18.

* * * * *